United States Patent [19]

Niehenke et al.

[11] 4,131,858

[45] Dec. 26, 1978

[54] BEAM LEAD DUAL PARAMETRIC AMPLIFIER

[75] Inventors: Edward C. Niehenke; Gerald I. Klein, both of Baltimore, Md.

[73] Assignee: Westinghouse Electric Corp., Pittsburgh, Pa.

[21] Appl. No.: 856,052

[22] Filed: Nov. 30, 1977

[51] Int. Cl.² ............................................. H03F 7/04
[52] U.S. Cl. ..................................... 330/4.9; 330/56
[58] Field of Search ........................................ 330/4.9

[56] References Cited

U.S. PATENT DOCUMENTS 3,842,360 10/1974 Dickens ............................... 330/4.9

OTHER PUBLICATIONS

Calviello et al., "Proc. IEEE" Mar. 1971, pp. 419–420.
Dickens, "1972 G-MTT International Microwave Symposium," pp. 55–57.

*Primary Examiner*—Rudolph V. Rolinec
*Assistant Examiner*—Darwin R. Hostetter
*Attorney, Agent, or Firm*—R. M. Trepp

[57] ABSTRACT

A parametric amplifier having a beam lead dual Schottky barrier diode fabricated on a single semiconductor chip across a waveguide cavity. Two anode leads are bonded to the adjacent waveguide walls for coupling to a pump source; and a common cathode lead is bonded to a signal circuit. Parasitic reactances are reduced by minimizing stray capacitance and beam lead series inductance.

18 Claims, 13 Drawing Figures

BEAM LEAD DUAL PARAMETRIC AMPLIFIER

BACKGROUND OF THE INVENTION

1. Field of the Invention

The present invention relates to a broadband parametric amplifer; and more particularly, to a parametric amplifier having a beam lead dual Schottky barrier diode fabricated on a single semiconductor chip.

2. Description of the Prior Art

Parametric amplification refers to a class of amplifiers where amplification at microwave frequencies has been achieved, wherein the output power is derived from an A.C. input, and derives its name from the fact that the differential equation governing the circuit behavior contains one or more reactive parameters which are non-linear or time varying. Parametric amplifiers can operate on the basis of periodically varying the capacitance of a Schottkybarrier varactor diode by means of a high frequency pump signal and transferring energy to a lower frequency microwave input signal by mixing of the input frequency with the much higher pump frequency through an idler frequency. The Manley-Rowe relations show that the current must flow at the three frequencies satisfying the relation:

Pump Frequency = Signal Frequency + Idler Frequency for gain to exist at the signal frequency.

A parametric amplifer employs one or more varactor diodes and a pump frequency source to obtain gain with extremely low noise figures. The pump frequency source strongly modulates or pumps the capacitance of the varactor diode at the pump frequency rate. Sum (upper sideband) and difference (idle) frequencies are generated due to the nonlinearity of the varactor diodes. The idle frequency circuit is reactively tuned (no resistive loading) for maximum current flow at the idle frequency while the upper sideband frequency circuit is adjusted for zero current flow at that frequency to achieve maximum gain and low noise figure characteristics.

In order to achieve broadband amplification, the idler circuit is preferably simple as possible consistent with having the required wide bandwidth characteristics. A dual diode parametric amplifier satisfies this requirement since filtering of the input signal in the signal circuit is not required due to the balanced nature of this circuit and, as series resonance of the diodes is employed for the idle frequency circuit, broadband operation results. The parasitic case capacitance associated with varactors packaged in a case limits the bandwidth of parametric amplifiers. Similarly the magnitude of the parasitic lead inductance of the varactor limits the resonant frequency of the idle circuit and hence limits the low noise figure values otherwise attainable. Additional resonators may be placed in the idle frequency circuit to raise this frequency, however, the bandwidth will be reduced.

Previous attempts to obtain broadband operation with high idle frequencies are described in the technical literature. For example, the paper entitled "A Millimeter Wave Varactor With Low Parasitics" by J. A. Calviello, P. R. Liegey, and B. Smilowitz, published in the Proceedings of the IEEE, Proceedings Letters Sections, March 1971, describes separate semiconductor chips with back to back mounting; a quartz horseshoe is used with quasi-planar passivated varactors with a separate connection. Also, the paper entitled, "An X-Band Paramp with 0.85 dB Noise Figure (Uncooled) and 500 MHz bandwidth" by L. Dickens, presented at the 1972 G-MTT International Microwave Symposium describes an arrangement employing planar passivated diodes with separate fine pointed wire to each diode junction. Both of the above examples have arrangements requiring individual matching of diodes (capacitance and inductance). This leads to a costly amplifier. In addition, the mechanical embedment of the varactor diode into the circuit is very complex. U.S. Pat. No. 3,,842,360 to Dickens illustrates a parametric amplifier of a type employing a pair of Schottky barrier diodes fabricated on a single semiconductor chip whereby the body is formed with four bonding pads which is commonly known as flip-chip construction. In mounting the chip across the juncture of a slot line and a co-planar line, it is required that all four pads made equal ohmic contact simultaneously; mechanical pressure is applied to obtain this contact. Problems encountered with this "flip-chip" construction include, first, and inability to control and to resonate the idler in the immediate vicinity of the diodes since the idler energy is coupled to and propagates down the slot line toward the pump source and the slot line radiates and couples to spatially distributed modes both above and below the substrate. This "flip-chip" construction leads to gain instabilities, narrow band performance, and high noise figure. Second, undue difficulty will be experienced in obtaining equal ohmic contact simultaneously when the pads are pressed against the said junction; unequal ohmic contact of the four pads causes imbalance of fringing capacitance across the junction.

The present invention satisfies the need for a parametric amplifier providing amplification with extremely wide bandwidth and low noise figure characteristics.

SUMMARY OF THE INVENTION

Briefly, the present invention is directed to a balanced parametric amplifier which achieves high amplification of microwave signals with extremely wide bandwidth and a low noise figure. A beam lead dual diode Schottky barrier semiconductor chip is mounted across a microwave waveguide cavity in balanced configuration with the anode beam leads joined to the opposing walls of the cavity and the common cathode beam lead joined to a microstrip microwave transmission line. The input signal is conducted by the transmission line to the dual diode circuitry and the amplified reflected signal is conducted by the same transmission line to the circulator port. A pumping circuit assembly provides pumping energy which is coupled to the said cavity to vary the capacitance of the dual diode circuitry at the pump frequency. The difference of the pump frequency and the signal frequency is the frequency of the idler current which is produced in the dual diode circuitry. The idler current is maximized to produce maximum gain. Losses are minimized in the idler circuit by providing a low inductance metallic ribbon or film to bridge the microwave cavity in proximity to the dual diodes on the semiconductor chip and by tapering the anode beam leads from their position at the respective anode electrodes to the width of a second portion of the beam leads. Overlap capacitance in the semiconductor chip is minimized by reducing the cross-sectional areas of the semiconductor substrates underlying the anode beam leads. The transfer of pump power into the microwave waveguide cavity and the diode circuitry is obtained by adjustment of the impedance characteristic of the pump circuit assembly and by mounting the dual diode semiconductor chip offset by a predetermined distance from the center of the microwave cavity.

DESCRIPTION OF THE PREFERRED EMBODIMENT

Figure 1:
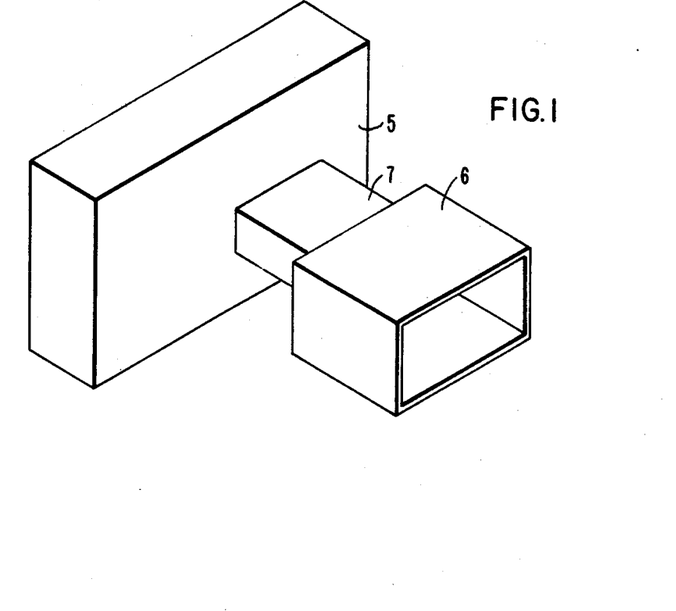
FIG. 1 is a highly magnified fragmentary view in perspective of a parametric amplifier according to one embodiment of the present invention in assembled condition.
Figure 2:
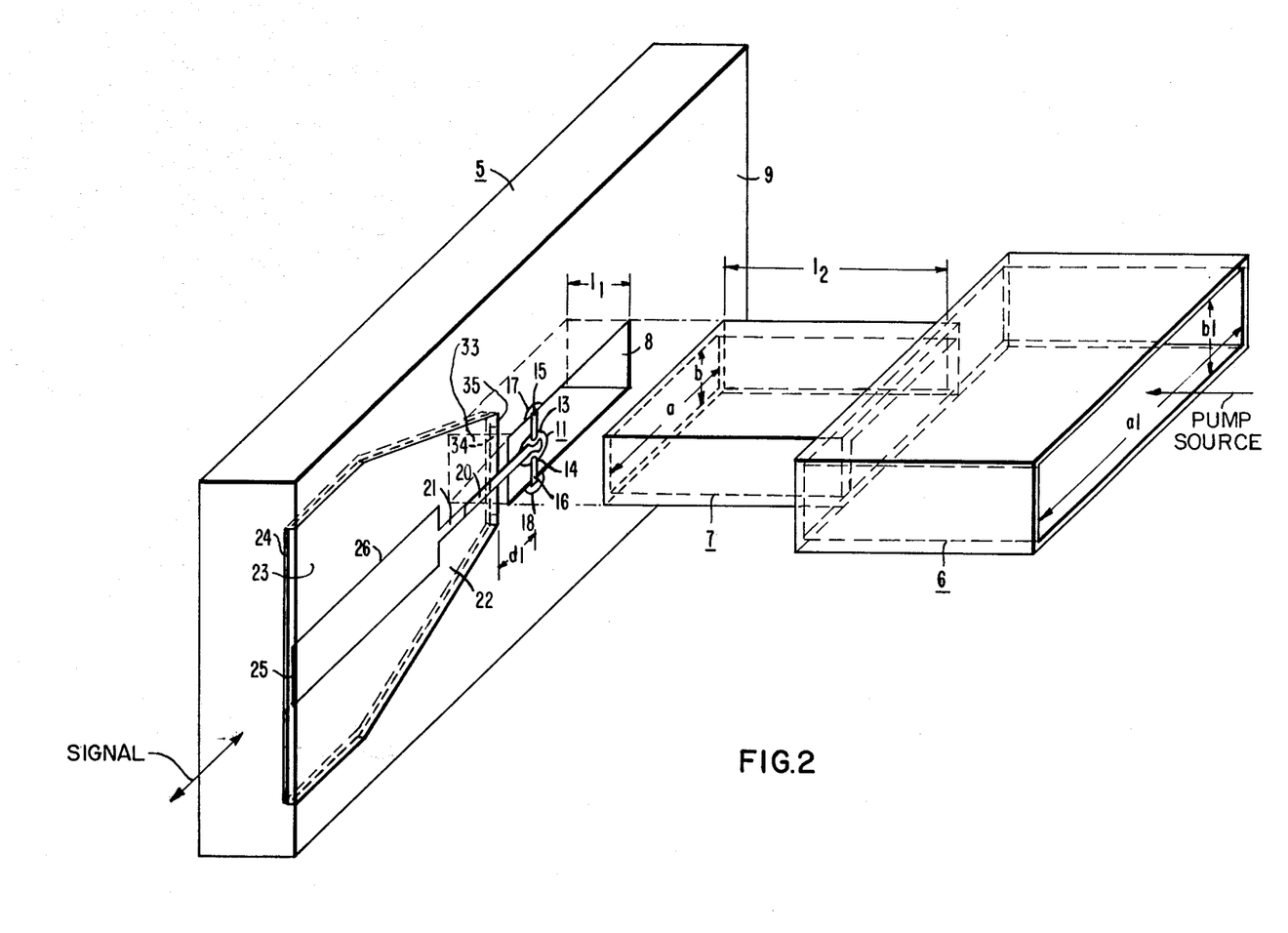
FIG. 2 is a partially exploded view of the parametric amplifier of FIG. 1 to show the interior structure.

One embodiment of a parametric amplifier of the present invention is shown in FIG. 1 in an assembled condition to illustrate its general appearance. An electrically conducting metal plate 5 contains the signal, idler, and pumping circuit components (not shown). A first microwave pump waveguide 6 propagates the pump energy from its source (not shown) to a second microwave pump waveguide 7 which further propagates the pump energy from the first waveguide 6 to the microwave cavity (not shown) in metal plate 5 and is of special geometry to prevent the idler current from being propagated from said microwave cavity into the second waveguide 7. FIG. 2 illustrates the interior details of the parametric amplifier assembly shown in FIG. 1. The microwave cavity 8 formed in surface 9 of metal plate 5 is bridged by a semiconductor chip 11. A pair of diodes 13 and 14 fabricated in chip 11 have anode beam leads 15 and 16, respectively, which are bonded, for example, by thermocompression means, in the indentations 17 and 18 formed in the opposing top and bottom broad walls of metal plate surface 9. The diodes 13 and 14 are in a balanced configuration for geometrically isolating the signal circuit of the parametric amplifier from signals generated in the diode; the balanced configuration is maintained by having the anode beam leads 15 and 16 extend outwardly in opposite directions from the chip 11. The cathode beam lead 20 is bonded, for example, by thermocompression means, to the signal tuning inductance 21 of the signal microstrip transmission line 22 signal circuit to be described hereinafter. Diodes 13 and 14, each connected between a waveguide wall and the signal tuning inductance 21, are in parallel and of like polarity across the microstrip line 22. The microstrip line 22 is formed on a dielectric substrate 23 which is bonded with, for example, electrically conductive adhesive onto plate 5. The ground plane for the microstrip line 22 is supplied by a metallized electrically conducting film 24 such as, for example, chromium gold. The microstrip line 22 extends from edge 25 of substrate 23 to its junction with the cathode beam lead 20 and carries incident signal power from a circulator (not shown) towards the dual diode chip 11 and carries reflected, amplified signal power away from the diodes 13 and 14 back to the circulator (not shown). The microstrip line 22 includes a first line section 26 of metallization which is adapted to be coupled to an external circuit such as a circulator (not shown).

First line section 26 has a length substantially equal to a quarter wavelength of the signal energy and couples into the second line section 21 of metallization having a generally rectangular configuration of substantially lesser width than the first line section 26. Furthermore, line section 26 has a low impedance value in order to raise the negative resistance of the diode pair to the proper value to achieve the desired gain. Section 21 functions as a signal tuning inductance to series resonate the signal frequency impedance made up of the average junction capacitance of the diodes 13 and 14 and the inductance of the beam leads; resonating the diode impedance minimizes the reactive loading of the diodes. This embodiment of the parametric amplifier combines a simplicity of signal circuitry (without the need for the chokes and resonators generally used) and low parasitic capacitance (in the order of 0.01 picofarad) of the dual diode semiconductor chip 11 to achieve extremely wide signal frequency bandwidth. This signal circuit coupled with the wide bandwidth idle frequency circuit, hereinafter described, results in an extremely wide bandwidth parametric amplifier capability.

Pump power for varying the capacitance of the dual diodes 13 and 14 of the pumping frequency, is introduced into the parametric amplifier at waveguide section 6; the pump power further propagates into waveguide section 7 of reduced geometric dimensions a, and b, wherein the waveguide cavity of section 7 has the same cross-sectional dimensions as those of microwave cavity 8. Section 7 is joined to plate 5 at surface 9 so that the respective waveguide cavities coincide and the respective waveguide walls are mechanically and electrically joined. The reduced geometric height b of the microwave cavity 8 and that of waveguide section 7 reduces the inductance at the idle frequency and matches the diodes 13 and 14 to the pump frequency at the pump source (not shown).

Width a of section 7 is less than one-half the wavelength at the idle frequency but wider than one-half the wavelength at the pump frequency, effectively cutting off the idler frequency described hereinafter, and propagating the pump power frequency; section 7 is thus a high pass filter for passing the pump frequency and for preventing the propagation of the idler frequency into the pumping source, (not shown). The inductive reactance of the dual diodes 13 and 14 at the idler frequency is reduced by mounting the semiconductor chip 11 at a selected location off-center with respect to microwave cavity 8 toward sidewall 33, its distance from the edge of sidewall 33 being indicated as $d_1$; also, in this location, the diodes 13 and 14 are matched at the pump frequency and the diodes are in series with opposed diode polarity across the electric field of the pump input.

In operation, the signal to be amplified is coupled by means of the microstrip circuitry 22 to the cathode 20 of the dual diodes 13 and 14 which are in parallel connection with respect to the signal source (not shown). Pumping power is supplied across diodes 13 and 14 from a pump source (not shown), via the pump waveguide sections 6 and 7. Diodes 13 and 14 are in series connection with respect to the pump source. When the pump and signal frequencies are applied simultaneously to diodes 13 and 14, an idler current is generated whose frequency is the pump frequency less the signal frequency. A low inductance path for the idler current is achieved by providing an electrically conductive, low inductance line such as, for example, a gold ribbon 34 adhesively connected to sidewall 33 bridging the waveguide cavity 8 or an alternate path for the idler current can also be achieved by providing a metallized electrically conductive film along edge 35 of the dielectric 23 which is joined to plate 5 so that edge 35 is contiguous with sidewall 33 and across waveguide cavity 8. The transmission of the signal and idler energies and the pump sections 7 and 6 is prevented by special geometry, hereinafter described, which permits the propagation of the pump frequencies but not the lower frequencies represented by the signal and idler energies. The pump energy does not propagate in the signal circuit because of the symmetry and balance of the dual diodes 13 and 14 in the pump waveguide; similarly, due to the balance of the signal circuit and its configuration, idler frequencies generated in the diodes will not propagate into the signal circuit. Consequently, the circuit path of the signal energy is restricted principally to the signal circuitry and the dual diodes 13 and 14, and the circuit path for the pump energy is restricted principally to the waveguide cavity 8 and the dual diodes. The idler current is restricted to the dual diodes and the metallic walls of the waveguide near the diodes and the conducting film bridging the waveguide cavity. Circuit losses are minimized to the greatest possible extent to maximize the idler current. For example, by virtual elimination of the resistive loading of the idler current circuit path, except for the low series resistance of the dual diodes 13 and 14, and by operating the parametric amplifier where the idler circuit, consisting mainly of the dual diodes, is series resonant at the idler frequency, maximizes the idler current for the highest gain and bandwidth and the lowest noise figure that is feasible with respect to the output signal.

The various waveguide dimensions are selected with the objective of minimizing losses. For example, since the series resistance of the dual beam diodes 13 and 14 is on the order of 1 to 3 ohms, depending in the capacitance used, and is quite low as compared to the waveguide impedance which is on the order of 300 ohms, an effective transformation system is required to deliver the pump power with low loss to diodes 13 and 14. Loss of pump power is minimized by the transforming factor $\sin^{-2} \pi d_1/a$ achieved by off-setting the semiconductor chip 11 from the center line of waveguide cavity 8. The length $l_1$ is selected to be approximately 0.3 $\lambda_{gp}$, where $\lambda_{gp}$ is the pump section wavelength, to parallel resonate the diodes 13 and 14 at the pump frequency. The length $l_2$ is selected to minimize the voltagestanding-waveratio (VSWR) into the standard pump port waveguide 6 of width a and height $b_1$; length $l_2$ is also approximately 0.35 $\lambda_{gp}$.

Figure 3:
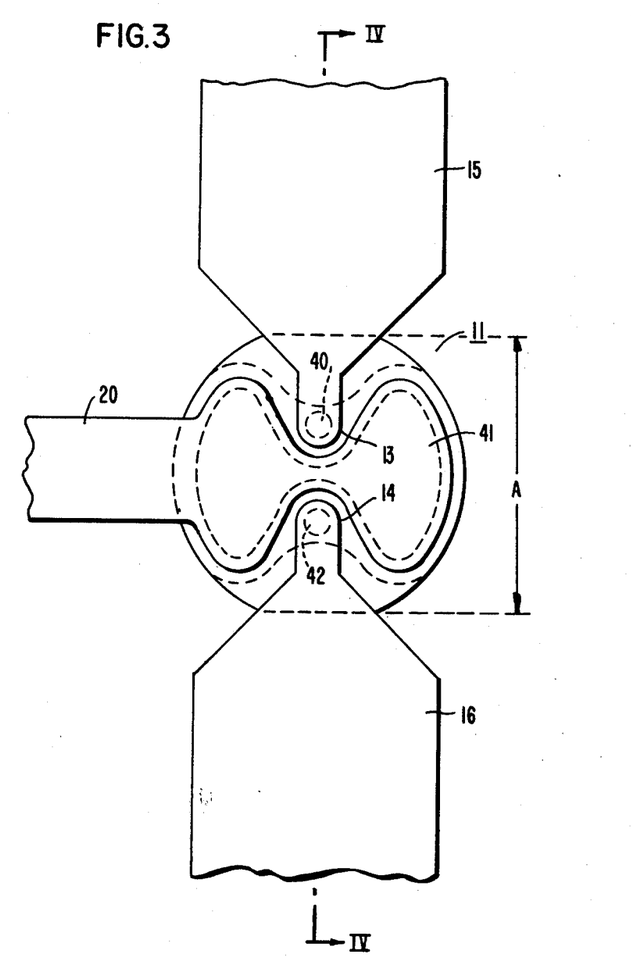
FIG. 3 is a highly magnified plan view of a beam lead dual diode semiconductor chip utilized in the parametric amplifier of the present invention.

FIG. 3 illustrates a semiconductor chip 11, barely visible to the unaided eye according to one actual device, comprised of beam lead dual Schottky barrier varactor diode sections 13 and 14. The diode section 13 is comprised of an anode 40 joined to a metal beam lead 15, and a cathode 41 joined to a metal beam lead 20. The diode section 14 is comprised of an anode 42 joined to a metal beam lead 16 and the cathode 41 common to the diode sections 13 and 14. The metal beam leads 15 and 16 are tapered outwardly for a short distance from anodes 40 and 42, respectively, to minimize the lead series inductance. In this embodiment, width A of the chip 11 is on the order of 0.007 inch; the inductance of the chip is approximately 0.11 nanohenry.

Figure 4:
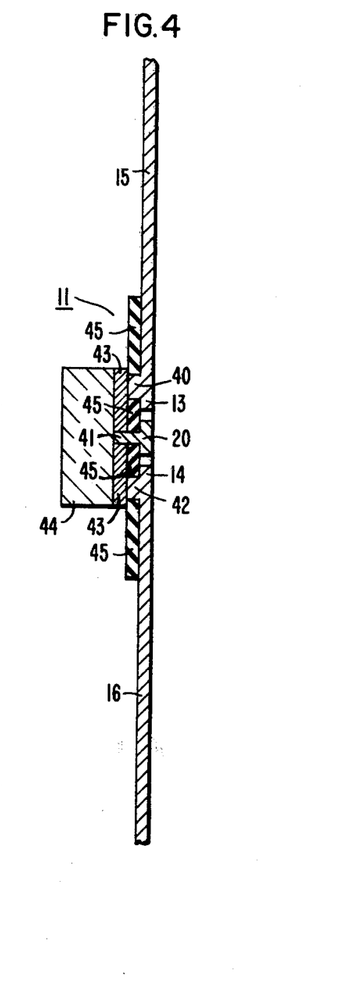
FIG. 4 is a sectional view of the semiconductor chip of FIG. 3 taken at line 4—4 looking in the direction of the arrows.

Referring now to FIG. 4, there is disclosed a cross-sectional view illustrative of the beam lead dual Schottky barrier varactor diode semiconductor chip 11. The chip 11 includes the pair of anode beam leads 15 and 16 contacting a semiconductor body comprised of a semiconductor layer 43 such as gallium arsenide having an N type semiconductivity epitaxially deposited on a semiconductor layer 44 of gallium arsenide having N+ semiconductivity. The chip 11 also includes the common cathode 41 with ohmic contact to the semiconductor layer 44. A passivating type oxide layer 45 is contiguous with the semiconductor layer 43. Well known standard photographic techniques and processes are used to remove the oxide layer 45 from the diode area 40 and 42 respectively and from the common cathode area 41; the epitaxial layer 43 is similarly removed from the common cathode area 41. The metal of the anode and cathode beam leads 15, 16 and 20 respectively is deposited into the cavities from which the oxide layer 45 and the epitaxial layer 43 respectively have been removed. The intimate contacts between the metal anodes 40 and 42 respectively, and the epitaxial layer 43 provide a metal-semiconductor interface commonly known as the Schottky barrier for the dual diode sections 13 and 14, respectively. The common cathode 41 for the diode sections 13 and 14 is achieved by the ohmic contact between the metal of cathode 41 and the semiconductor layer 44. In this embodiment, the overlay capacitance between the anode beam leads 15 and 16 and the substrates 43 and 44 is a function of the oxide thickness and the area of the substrates under the anode beam leads; an overlay capacitance on the order of 0.01 picofarad has been obtained. The oxide layer 45 is not removed with the substrate material in the reduction of the area of the substrates under the anode beam leads but is retained to provide mechanical support to the beam leads 15 and 16.

Photographic masking techniques having the accuracy and resolution required to fabricate a dual diode with its two sections well matched in inductance and capacitance on a single semiconductor chip are readily available with current solid state technology. The chip is extremely lightweight and can be mounted and supported by its own beam leads. Batch fabrication techniques make this chip compatible with low cost objectives.

Figure 5:
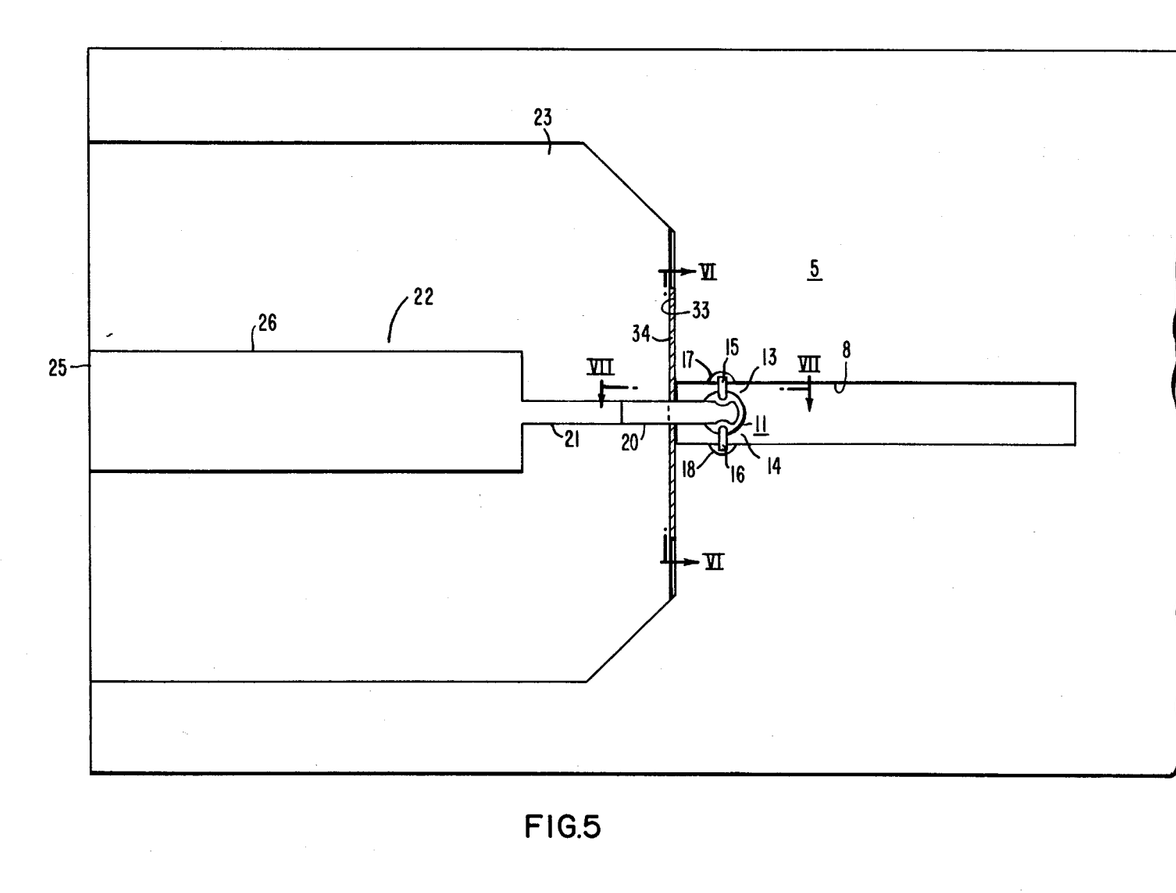
FIG. 5 shows a fragmentary view of the parametric amplifier of FIG. 2 to illustrate in more detail the mounting of semiconductor chip in FIG. 3.
Figure 6:
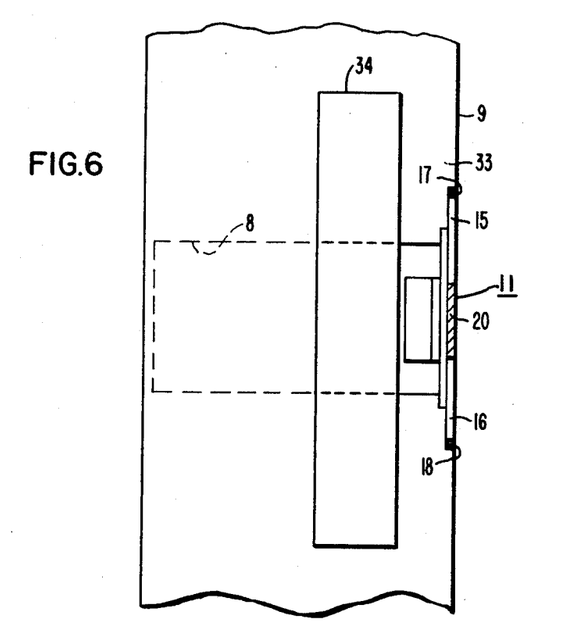
FIG. 6 is a fragmentary sectional view taken at line 6—6 of FIG. 5 looking in the direction of the arrows.
Figure 7:
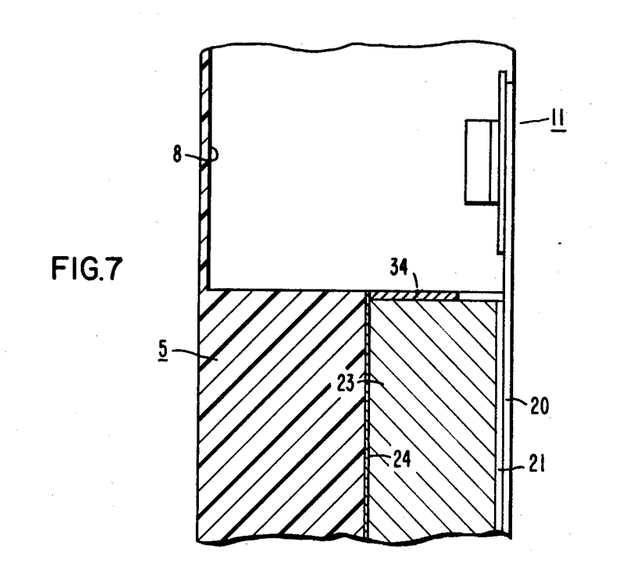
FIG. 7 is a fragmentary sectional view taken at line 7—7 of FIG. 5 looking in the direction of the arrows.

FIGS. 5, 6, and 7 show additional details in further explanation of the integration of the principal components of embodiment of the dual diode parametric amplifier shown in FIGS. 1 and 2. FIG. 5 illustrates the configuration of dual diode 11, bridging the waveguide cavity 8, with its anode beam leads 15 and 16 connected to the opposing broad walls of waveguide cavity 8 at indentations 17 and 18 respectively; the common cathode 20 is shown joined the signal tuning inductance section 21. The relative position of the electrically conductive strip 34 is shown across the microwave waveguide cavity 8 at the junction of the sidewall 33 and the dielectric substrate 23. FIG. 6 shows a sectional view of the relative positions of the conductive strip 34 with respect to the semiconductor chip 11, both bridging the waveguide cavity 8, where anode beam leads 15 and 16 are joined to the metal plate surface 9 at indentations 17 and 18, respectively. FIG. 7 shows the relative position of the dielectric substrate 23 and its electrically conductive ground plating 24, as attached to metal plate 5, with respect to the conductive film 34, the semiconductor chip 11, and the junction of cathode beam lead 20 with signal inductance section 21. The signal circuit comprised of section 21 and cathode beam lead 20 is isolated with respect to the waveguide walls and the conductive ribbon 34.

Figure 8:
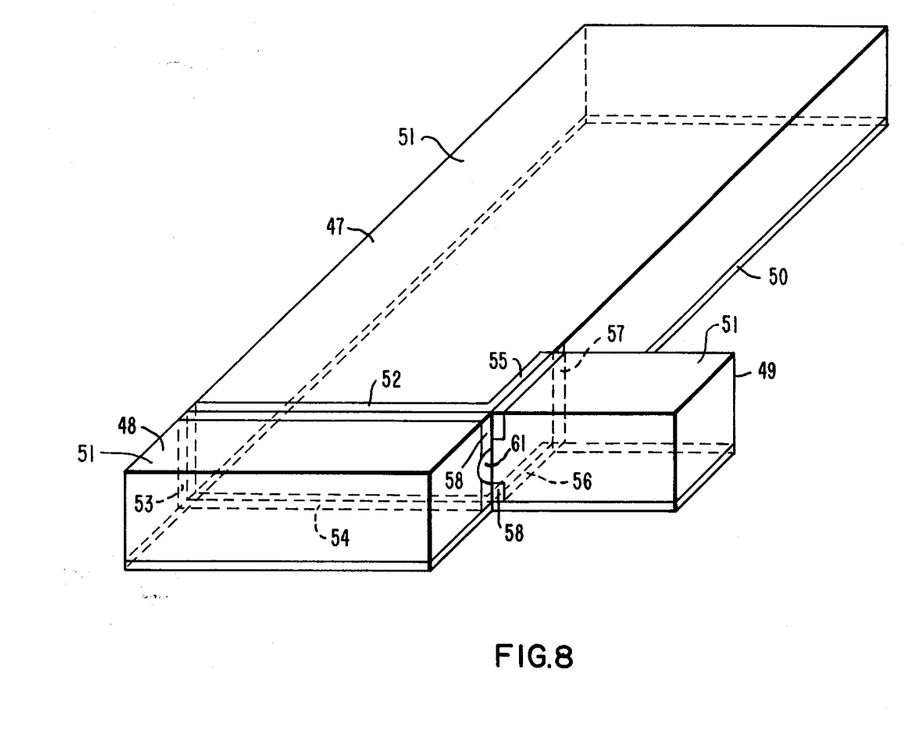
FIG. 8 is a highly magnified fragmentary view in perspective of another embodiment of a parametric amplifier according to the present invention in assembled position.
Figure 9:
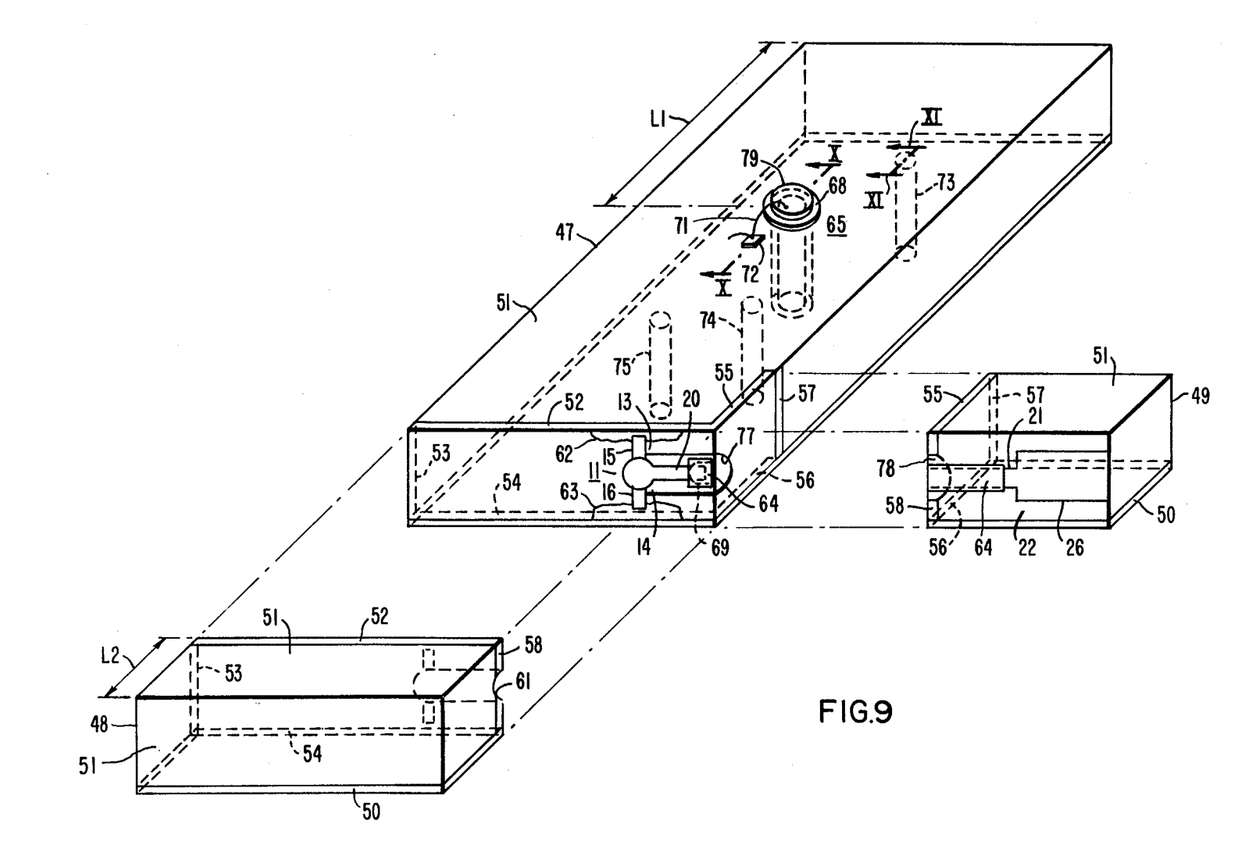
FIG. 9 is a partially exploded view of the parametric amplifier of FIG. 8 to show the interior structure.

Another embodiment of a parametric amplifier of the present invention is shown in FIG. 8 wherein three dielectric microwave waveguide sections are shown in an assembled condition. A pump power waveguide section 47 is joined to a shorting waveguide section 48 and to a signal waveguide section 49, all three sections are mounted on a supporting electrically conductive metal plate 50. Most of the surfaces of the sections 47, 48, and 49 are plated with electrically conductive coatings 51, and the seams where the sections are joined together are bonded with, for example, electrically conductive ribbons, the surfaces and seams respectively being shielded to the maximum possible extent to prevent the radiation of pump, idle, and signal energies to outside the parametric amplifier. The seams at three adjoining surfaces at the juncture of sections 47 and 48 are bonded by ribbons 52, 53, and 54, respectively. The seams at three adjoining surfaces at the juncture of sections 47 and 49 are bonded by ribbons 55, 56, and 57 respectively. The seam at the adjoining surfaces at the juncture of sections 48 and 49 are bonded by ribbon 58 except at the indentation 61 as hereinafter described. FIG. 9 illustrates the internal and external details of the assembly shown in FIG. 8. The beam lead dual diode semiconductor chip 11 is mounted on the front surface of section 47 with its anode beam leads 15 and 16 bonded to plating tabs 62 and 63, respectively; tabs 62 and 63, made wide to minimize inductance, are extensions of the platings on the top and bottom surfaces of section 47 respectively. The semiconductor chip common cathode beam lead 20 is joined by the bonding ribbon 64 to the signal tuning inductance microstrip section 21 formed in dielectric signal waveguide section 49.

Figure 10:
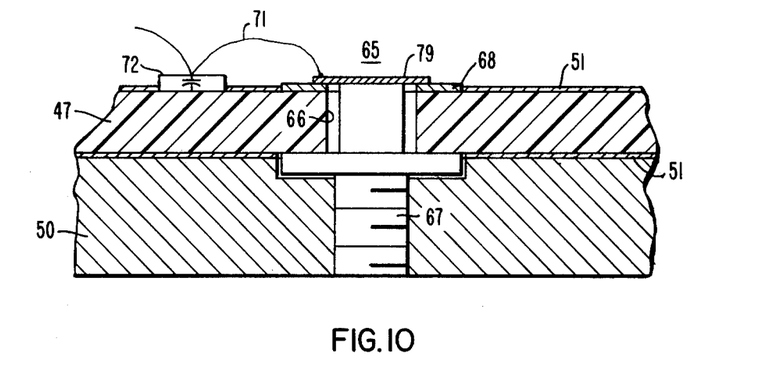
FIG. 10 is a greatly enlarged sectional view of the Gunn diode assembly in FIG. 9 taken at line 10—10 looking in direction of the arrows.
Figure 11:
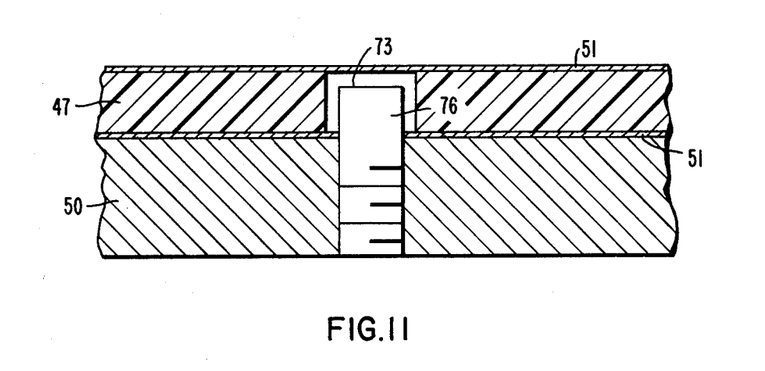
FIG. 11 is a greatly enlarged sectional view of a tuning slug in FIG. 9 taken at line 11—11 looking in direction of the arrows.

The primary energy for the parametric amplifier in this embodiment is provided by a Gunn diode 65 located a distance of $l_1$ from the back wall of the pump waveguide section 47 where $l_1$ is equal approximately to one-half the wavelength of the pump frequency. The cavity of the diode 65 circuit is formed between the diode 65 and the back wall section 47. Gunn diode 65 is, for example, a low negative impedance diode as is the dual diode semiconductor chip 11. In this embodiment neither diode is matched to standard high impedance waveguide, but are matched to each other in a low impedance waveguide 47. Thus, the pump section 47 is fully integrated into the parametric amplifier in this embodiment. Space 66 allows clearance for the Gunn diode 65 from dielectric 47 as shown in FIGS. 9 and 10; its screw base 67 in the metal mounting plate 50 provides low thermal resistance for removal of heat which may develop from the operation of diode 65. An electrically conductive foil 79 is attached to the top surface of diode 65 and to the radial open-circuited choke 68 which is of low impedance and one-quarter wave length of the pump signal frequency. A small wire 71 is connected from the diode 65 circuit to a stand off capacitor 72, having a high capacitance to ground, thence to the diode bias power supply (not shown). The only opening in the top surface plating of section 47 is that required for the Gunn diode 65 and its surrounding space 66. The oscillator tuner 73, the attenuator 74, and the tuner 75, do not penetrate the top surface of section 47 but are adjusted from beneath the metal supporting plate 50. Tuner 73 and 75 have metal or dielectric tuning slugs whereas attenuator 74 has a lossy slug, otherwise these three adjustable controls are similar physical characteristics represented by FIG. 11. Tuner 73 is placed between the Gunn diode 65 and the back wall of waveguide section 47 and is adjusted to vary the resonant frequency of diode 65; tuner 73 is effective even if placed in the back wall of the waveguide. Tuner 73 is adjusted from beneath the metal supporting plate 50 by moving a metal or dielectric slug 76 through an opening in the plate 50 and adjoining dielectric 47. Attenuator 74 is placed near an edge of section 47 for magnetic coupling with low insertion VSWR. Adjustments of attenuator 74 varying the pump output power to the predetermined level are made from beneath the metal plate 50 by moving a slug of lossy material through an opening in plate 50 and adjoining dielectric 47. In like manner, one or more tuners 75 located between attenuator 74 and the front wall of waveguide section 47 are adjusted, each by moving a slug of dielectric or metal, to obtain optimum matching of impedance levels between the dual diodes on the semiconductor chip 11 and the Gunn diode 65.

The dielectric waveguide section 47 is geometrically configured such that it will pass the pump frequency but will not propagate the idler frequency. The distance $l_2$ of the semiconductor chip 11 from the back wall of the shorting dielectric section 48 is approximately 0.3 of the wavelength of the pumping frequency in order to parallel resonate diode chip 11. Diode chip 11 is placed close to the edge of section 47 to increase the small value of the parasitic series resistance of the chip.

The back wall of section 48 is unplated. It joins to the front wall of section 47 and provides indentations for the physical presence of the semiconductor chip 11 and its anode and cathode beam leads, 15, 16, and 20 respectively. For example, indentation 61 provides space for the bonding ribbon 64 to pass from the dielectric signal section 49 to the dielectric pump section 47. The right hand side wall of section 48 is completely plated except for the space required to isolate the plating from the signal conductor 64; bonding ribbon 58 extends only as far as the indentation.

A microstrip transmission line 22 is formed on the front face of the dielectric section 49. The first section 26 is one-quarter of the wavelength of the signal frequency and is joined to the tuning inductance 21. There is no conductive plating on the front face of section 49 other than the transmission line 22. The plating on the left hand side wall of section 49 provides a semi-circular unplated area 78 to isolate the signal conductor 64 from the conductive plating; similarly, the plating on the right hand side of section 47 provides a semiconductor unplated area 77 to isolate the signal conductor 64 from the conductive plating. All other surfaces of section 49 are completely plated with conductive film.

The operation of the signal and idler circuit is the same as for the embodiment of the parametric amplifier shown in FIGS. 1 and 2 with the exception that conductive strip 34 is not required for the parametric amplifier shown in FIGS. 8 and 9 since the plating on the right hand wall of section 47 completes the idler current circuit.

Figure 12:
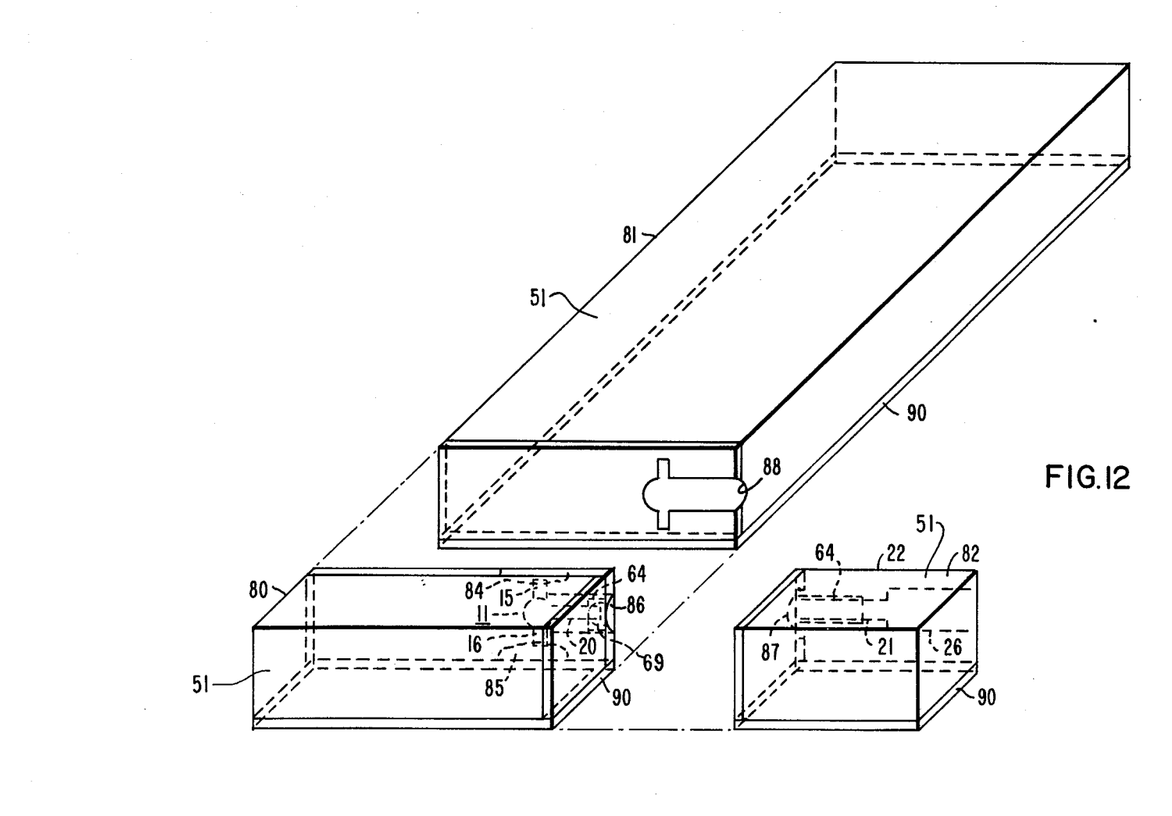
FIG. 12 is a highly magnified exploded fragmentary view in perspective of still another embodiment of a parametric amplifier according to the present invention showing those differences between this embodiment and the embodiment of FIGS. 8 and 9.

Still another embodiment of the parametric amplifier of the present invention is shown in FIG. 12. This is a variation of the embodiment shown in FIGS. 8 and 9; and is different in that the beam lead dual diode semiconductor chip 11 is mounted on the back wall of shorting dielectric waveguide 80 and the anode beam leads 15 and 16 are bonded to the conducting tabs 84 and 85, respectively in the back wall which are extensions of the conducting top and bottom surfaces of section 80. The cathode beam lead 20 is bonded to plated area 69 which is isolated from the conducting surfaces of the dielectric waveguide. A ribbon 64 is bonded to the plated area 69 and to the signal tuning inductance 21. The semi-circular area 86 on the right hand surface of section 80 and the semi-circular area 87 on the left hand surface of section 82 are free of conductive plating to isolate the conductive ribbon 64 from the conductive plating. The unplated front surface of pump dielectric waveguide 81 has an indentation 88 formed therein to provide clearance for the semiconductor chip 11 and the beam leads when the sections 80 and 81 are joined. All surfaces of the dielectric waveguide sections 80, 81, and 82 are plated with a conductive film 51 other than the surfaces and portions of surfaces described in the foregoing. All seams are bonded with conductive ribbon except where isolation of the signal ribbon 64 is required. The dielectric sections are mounted on metal supporting plate 90.

Figure 13:
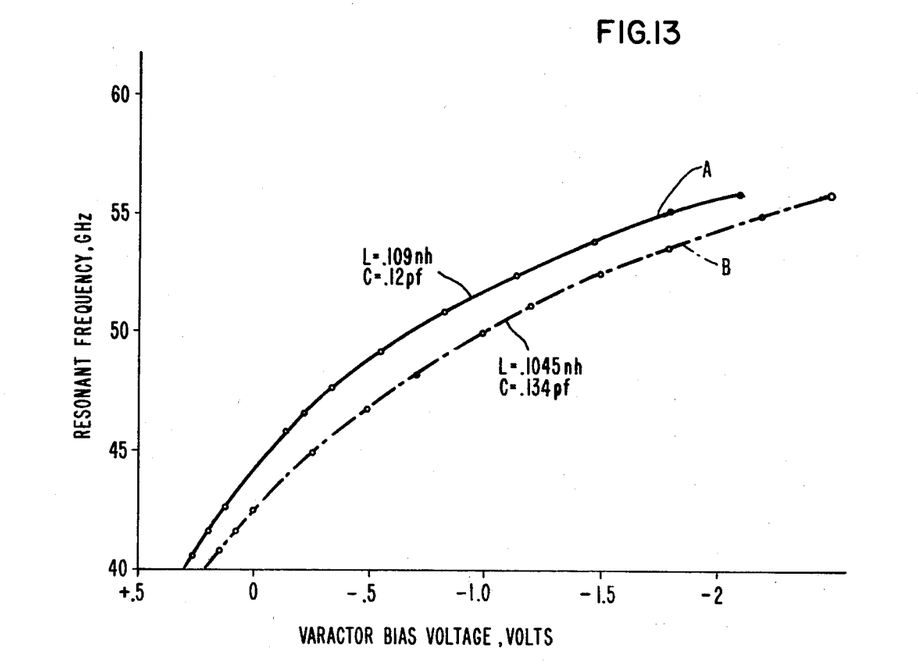
FIG. 13 is a graphical illustration of the operation of the embodiment of the parametric amplifier of the present invention.

Tests have shown that a parametric amplifier utilizing a beam lead dual diode semiconductor chip as described in FIGS. 1 and 2 can be resonated in this general mounting configuration at frequencies ranging from at least 40 to 50 gigahertz. An extremely wide range of idler frequencies are obtainable and the pump frequency can be in the millimeter range to yield a large gain bandwidth product and low noise performance at room temperature. The curve graphs in FIG. 13 illustrate the resonant frequency characteristics of a parametric amplifier with a beam lead dual diode semiconductor chip mounted in a signal waveguide to bridge a cavity having a height, b, of 0.011 inch and a width, a, of 0.188 inch. Curve A was obtained with the dual diode circuit having a zero bias junction capacitance of 0.12 picofarad and an inductance of 0.109 nanohenry; for curve B, the capacitance is 0.134 picofarad and an inductance of 0.1045 nanohenry. The inductance can be lowered by further reducing the dimensions of the waveguide cavity.

This invention is not limited to the specific embodiments shown in the drawings and described in the specifications, but it is adaptable to numerous other modifications and changes, without departing from the spirit and scope hereof, to produce a parametric amplifier structure characterized by extremely wide band width, low signal noise, high reproducibility, low production costs, and highly reproducible batch fabricated dual beam varactor semiconductor diodes and photolithographically reproduced thin film microwave circuitry on low cost dielectric substrates.

What is claimed is:

1. A balanced parametric amplifier, comprising:
   a plate for providing a conductive path for electrical currents, said plate having a first surface and a second adjoining surface forming an angle with said first surface;
   a microwave waveguide cavity formed in said first surface and communicating with said second surface;
   a microwave transmission line to provide a microwave signal circuit, said line extending to a position adjacent to the cavity at the second surface of the plate;
   a pumping circuit assembly coupled to said microwave waveguide cavity and said first plate surface; and
   an assembly including a pair of balanced Schottky beam lead varactor diodes fabricated on a single semiconductor chip with a common cathode connection, each having a beam lead anode extending outwardly therefrom, said diodes being joined by the outer ends of said beam leads to said first plate surface to bridge the microwave waveguide cavity, said common cathode connection being joined by a beam lead to said microwave transmission line adjacent to the microwave waveguide cavity.

2. A balanced parametric amplifier as defined in claim 1 wherein an insulating member is integral with said plate, said member having a portion adjacent to the microwave waveguide cavity at said second surface and an electrically conductive microstrip transmission line is deposited on said insulating member to provide in cooperation with said insulating member the said microwave signal circuit.

3. The parametric amplifier as defined in claim 1 wherein said semiconductor chip comprises:
   a first layer of a passivating oxide formed on a second layer of semiconductor substrate, and said second layer being formed on a third layer of semiconductor substrate; and
   a pair of diode sections each including a metal anode electrode extending through said first layer and joined in ohmic contact with said second layer, and a common cathode electrode extending through both the said first layer and the said second layer and joining in ohmic contact with said third layer.

4. The parametric amplifier as defined in claim 3 wherein:
   said first layer of passivating oxide is silicon dioxide, and
   said second and third layers of semiconductor substrate, gallium arsenide of N type and N+ type semiconductivity, respectively.

5. A parametric amplifier according to claim 1 wherein each of said anode beam leads are configured to taper outwardly from its respective diode to gradually increase its beam lead width for at least a portion of its length.

6. A parametric amplifier according to claim 5 wherein each of the anode beam leads has a portion of substantively equal width extending outwardly from the tapered portion.

7. A parametric amplifier as defined in claim 3 wherein the cross-sectional areas of the portions of each of the second and third layers underlaying the anode beam leads are such to reduce the capacitance between the substrate layers and the beam leads to at least substantially 0.01 picofarad.

8. A balanced parametric amplifier as defined in claim 2 wherein the insulating member is plated with a ground plane electrically conductive film on its surface adjoining the plate and the microstrip transmission line, deposited on its opposite surface, comprising a first line portion having a length substantially equal to one-quarter wavelength of the input signal frequency and electrically connected to a second line portion of selected geometry to function as a signal circuit series tuning inductance; the electrically conductive ground plane film and the microwave conductor on opposite surfaces of said insulating member comprising a microwave microstrip transmission line; and
  a third surface of said insulating member positioned so that said third surface of the insulating member is adjacent to said second surface of the microwave cavity and the second line portion of the microwave microstrip transmission line conductor is aligned with and joined to the said common cathode beam lead.

9. A balanced parametric amplifier according to claim 3 wherein the microwave transmission line conductor has a first portion having a width greater than the remainder of its length, said first portion being of a length substantially equal to one quarter wavelength of input signal frequency and said remainder portion being joined to and of a width substantially equal to the common cathode beam lead and of a length such that its inductive reactance is resonant with the capacitive reactance of the said chip; and
  said chip is positioned to bridge the cavity closer to the end of the cavity adjacent the remainder portion of the transmission line to reduce the inductive reactance of the chip at the idler frequency.

10. A balanced parametric amplifier defined in claim 1 wherein the said diodes are in series with opposed diode polarity across the electric field of the pump input.

11. A balanced parametric amplifier defined in claim 1 wherein the said diodes are in series across the waveguide cavity and in parallel across the signal transmission line.

12. A balanced parametric amplifier as defined in claim 1 wherein the pump circuit assembly is comprised of:
  a first section of microwave waveguide propagating at the pumping energy frequency joined to;
  a second section of microwave waveguide, of selected geometry to propagate at the pumping frequency but cut off at the signal and idler frequencies, is joined to said first surface of said plate and positioned thereon to couple the pumping energy into said microwave waveguide cavity formed in said first surface.

13. A balanced parametric amplifier as defined in claim 1 wherein the plate is electrically conductive metal.

14. A balanced parametric amplifier as defined in claim 13 wherein an electrically conducting low inductance metallic means is mounted on said second plate surface adjacent to said transmission line insulating member and bridging the said microwave waveguide cavity to provide a continuous electrical path for the idler current.

15. A balanced parametric amplifier as defined in claim 13 wherein the microwave waveguide cavity is hollow and includes a pair of mutually parallel broad and narrow walls and wherein said beam lead dual diode semiconductor chip is mounted parallel to the said narrow walls bridging said microwave waveguide cavity.

16. A balanced parametric amplifier as defined in claim 12 wherein the plate is dielectric having a dielectric microwave waveguide cavity and wherein the pumping circuit assembly is a dielectric waveguide pumping circuit assembly.

17. A balanced parametric amplifier as defined in claim 16 wherein a low impedance pump power source is within the dielectric waveguide pumping circuit assembly and is matched in impedance to the impedance of said varactor diodes by said pumping circuit assembly.

18. A balanced parametric amplifier as defined in claim 17 wherein the dielectric waveguide pumping circuit assembly prevents the propagation of signal and idler frequencies into said dielectric waveguide pumping circuit assembly and permits the propagation of pump frequencies.

* * * * *